United States Patent
Daigle et al.

(10) Patent No.: US 7,146,283 B2
(45) Date of Patent: Dec. 5, 2006

(54) CALIBRATING ANALOG-TO-DIGITAL SYSTEMS USING A PRECISION REFERENCE AND A PULSE-WIDTH MODULATION CIRCUIT TO REDUCE LOCAL AND LARGE SIGNAL NONLINEARITIES

(75) Inventors: Clayton H. Daigle, Austin, TX (US); Christopher G. Regier, Austin, TX (US); Antony Wangsanata, Austin, TX (US); Lauren R. Sjoboen, Austin, TX (US)

(73) Assignee: National Instruments Corporation, Austin, TX (US)

( * ) Notice: Subject to any disclaimer, the term of this patent is extended or adjusted under 35 U.S.C. 154(b) by 5 days.

(21) Appl. No.: 11/107,342

(22) Filed: Apr. 15, 2005

(65) Prior Publication Data

US 2005/0197796 A1    Sep. 8, 2005

Related U.S. Application Data

(60) Provisional application No. 60/601,939, filed on Aug. 16, 2004.

(51) Int. Cl.
*H03M 1/10* (2006.01)

(52) U.S. Cl. .................. 702/107; 702/86; 702/78; 702/79; 341/126; 341/120; 341/155

(58) Field of Classification Search ................ 702/107, 702/85, 86, 106, 75, 78, 79, 69, 124–126, 702/57, 64, 127, 189
See application file for complete search history.

(56) References Cited

U.S. PATENT DOCUMENTS

| | | | |
|---|---|---|---|
| 5,648,918 A | 7/1997 | Hubbard | 702/107 |
| 5,771,012 A * | 6/1998 | Shu et al. | 341/118 |
| 6,144,326 A | 11/2000 | Krone et al. | 341/118 |
| 6,232,897 B1 | 5/2001 | Knusen | 341/120 |
| 6,289,070 B1 | 9/2001 | Krone et al. | 375/377 |
| 6,323,792 B1 | 11/2001 | Regier | 341/118 |
| 6,323,796 B1 | 11/2001 | Krone et al. | 341/143 |
| 6,380,874 B1 | 4/2002 | Knudsen | 341/118 |

(Continued)

OTHER PUBLICATIONS

U.S. Appl. No. 09/665,990, filed Sep. 20, 2000, by Paul Packebush and Costa Ilic.

*Primary Examiner*—Hal Wachsman
(74) *Attorney, Agent, or Firm*—Meyerstons Hood Kivlin Kowert & Goetzel, P.C.; Jeffrey C. Hood; Mario J. Lewin

(57) ABSTRACT

A calibration unit and technique for calibrating A/D systems (e.g., data acquisition devices) using a pulse-width modulation (PWM) circuit to reduce nonlinearity. The calibration unit may be coupled to an analog-to-digital module (ADM) of the A/D system. The PWM circuit may generate a calibration signal with intentional ripple, which may exercise a region of a transfer curve of the ADM to reduce local nonlinearities in measurements associated with the calibration of the system. Pulse trains of varying frequency and duty cycle may be generated to sweep the PWM circuit through an ADM range and to calculate an ADM linearity correction function, which may be used to perform gain and offset correction with respect to a best-fit line through an ADM transfer curve to reduce large signal nonlinearities. The PWM circuit may include a resistor divider circuit including a plurality of taps to calibrate small input ranges.

46 Claims, 6 Drawing Sheets

U.S. PATENT DOCUMENTS

| | | | |
|---|---|---|---|
| 6,442,213 B1 | 8/2002 | Krone et al. | 375/285 |
| 6,583,741 B1 | 6/2003 | Knudsen | 341/143 |
| 6,795,004 B1 * | 9/2004 | Masuda et al. | 341/143 |
| 6,842,134 B1 * | 1/2005 | Paquet | 341/152 |
| 6,970,118 B1 | 11/2005 | Regier | 341/118 |
| 2002/0012368 A1 | 1/2002 | Kleinschmidt et al. | 372/32 |
| 2002/0095266 A1 | 7/2002 | Barbour et al. | 702/104 |
| 2003/0008401 A1 | 1/2003 | Berndt | 436/8 |
| 2003/0038933 A1 | 2/2003 | Shirley et al. | 356/243.1 |
| 2003/0048862 A1 | 3/2003 | Lee | 375/370 |
| 2003/0144583 A1 | 7/2003 | Cheng et al. | 600/322 |
| 2004/0179118 A1 | 9/2004 | Itani | 378/255 |
| 2004/0201844 A1 | 10/2004 | Loney | 356/318 |

\* cited by examiner

| Duty Cycle | PWM DAC Out | Returned Data | Linearity Corrected Data |
|---|---|---|---|
| 5% | 9.5V | 32K | 31.9K |
| 10% | 9.0V | 29K | 29.5K |
| 15% | 8.8V | 27.5K | 27.8K |
| . | . | . | . |
| . | . | . | . |
| 85% | -8.8V | -27.7K | -28.2K |
| 90% | -9.0V | -29.5K | -29.5K |
| 95% | -9.5V | -32K | -31.3K |

CALIBRATING ANALOG-TO-DIGITAL SYSTEMS USING A PRECISION REFERENCE AND A PULSE-WIDTH MODULATION CIRCUIT TO REDUCE LOCAL AND LARGE SIGNAL NONLINEARITIES

PRIORITY CLAIM

This application claims benefit of priority of U.S. provisional application Ser. No. 60/601,939 titled "Data Acquisition Device Having Improved Calibration", filed Aug. 16, 2004.

BACKGROUND OF THE INVENTION

1. Field of the Invention

This invention relates generally to measurement and data acquisition systems and, more particularly, to an improved method and apparatus for calibrating analog-to-digital systems.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system with a measurement device or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal conditioning devices which receive the field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a unit under test.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor.

In a measurement or data acquisition process, analog signals may be received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. When a measurement system generates an analog output, the computer system may generate digital signals that are provided to one or more digital to analog converters (DACs) in the DAQ device. The DACs convert the digital signal to an analog output signal that is used, e.g., to stimulate a UUT.

Typically, measurement devices, such as data acquisition (DAQ) devices, digital multi meters (DMMs), and digital storage oscilloscopes (DSOs) need to be adjusted to provide accurate measurements of DC input signals via a method called DC voltage calibration. A basic form of calibration is for the user to supply the device with a known voltage and manually make adjustments to the device (for example, turn a trim pot or calculate mathematical correction terms). If the device has multiple input ranges, the user may need to follow a procedure for dialing in several voltages and manually adjusting each range.

More advanced multi-range devices may require the user to just provide a single voltage, which may be scaled internally by the device to calibrate its various ranges. Some devices may have an onboard precision reference so that they may be calibrated without any external connections (typically referred to as "self-calibration"). However, even these devices may occasionally need an "external calibration" procedure, where the internal reference itself may be adjusted and brought back in line with traceable voltage standards.

In prior methods of calibration, the calibration signal may simply be a very accurate DC voltage which the device uses as a "measuring stick" to make adjustments against. The drawback is that readings may be sensitive to the device's local nonlinearities (such as ADC quantization) as well as to large signal nonlinearities (such as 'S' shapes), both of which may make it difficult to determine the true "gain" and "offset" of a measurement device. This may be particularly a problem for devices such as DAQ boards where quantization errors may be significant or even dominant.

Additionally, scaling a precision reference to accommodate multiple input ranges may also be challenging. One of the most common methods is to divide down the precision reference using a precision resistive divider, whose accuracy is limited by the initial matching of the resistors and/or by the relative drift of the resistors. Other devices use a pulse-width modulation (PWM) circuit to scale a precision reference for various ranges. A PWM circuit is typically a circuit that accepts a precision reference and a digital pulse train as inputs, and provides as output a signal with an average value that is proportional to the duty cycle of the pulse train input. In these devices, the PWM circuit typically outputs a DC waveform with no ripple. These circuits are often accurately described as PWM digital-to-analog converters (PWM DACs) and are excellent during calibration both for their flexibility and for their good linearity.

SUMMARY OF THE INVENTION

Various embodiments of an apparatus and method for calibrating analog-to-digital systems using a precision reference and a pulse-width modulation circuit to reduce local and large signal nonlinearities are disclosed. A calibration unit may be comprised in various types of analog-to-digital systems, such as data acquisition devices, digital multimeters, digital storage oscilloscopes, and other types of devices for acquiring or generating data. The calibration unit may generate a calibration signal with intentional ripple to reduce local nonlinearities and may implement a linearity characterization technique to reduce sensitivity to large signal nonlinearities to improve calibration of the analog-to-digital system.

The calibration unit may include a pulse-width modulation (PWM) circuit, a precision reference, and a digital logic unit to calibrate the analog-to-digital system (e.g., a data acquisition device). In one embodiment, the digital logic unit may provide the PWM circuit with a pulse train of a programmable frequency and the precision reference may provide the PWM circuit with a precision reference signal. In response to receiving the pulse train and the precision reference signal, the PWM circuit may generate a calibration signal with intentional ripple. The calibration unit may be coupled to analog-to-digital module (ADM), which may include conditioning circuitry and one or more analog-to-digital converters (ADCs), to provide the calibration signal with ripple. The ripple may exercise a region of a transfer curve of the ADM to reduce local nonlinearities in measurements associated with the calibration of the analog-to-digital system.

The calibration unit may further include a control unit. In one embodiment, the control unit may program the digital logic unit to generate pulse trains of varying frequency and duty cycle to sweep the PWM circuit through an ADM range and to calculate an ADM linearity correction function. The ADM linearity correction function may be used to perform gain and offset correction with respect to a best-fit line through an ADM transfer curve to reduce large signal nonlinearities.

In one embodiment, the PWM circuit may include a resistor divider circuit including a plurality of taps to improve the ability to calibrate various input ranges. For example, a first tap of the PWM circuit may correspond to the ±10V range, a second tap may correspond to the ±2V range, and a third tap may correspond to the ±0.5V range. It is noted however that the PWM circuit may include any number of taps corresponding to any voltage range. In one embodiment, after calibrating the gain, offset, and linearity of the range associated with the first tap (e.g., ±10V range), the calibrated range may be used to calibrate the slope of the PWM circuit (e.g., the slope of the first tap). When the slope of the PWM circuit is calibrated, it may be used to calibrate smaller input ranges, e.g., a ±5V range and a ±2V range. One of the smaller ranges (e.g., ±2V range) may be associated with the second tap. Once the smaller range is calibrated, the slope of the second tap may be calibrated. In other words, each tap may be calibrated by comparing the output of a calibrated tap to the output of an uncalibrated tap.

Figure 1:
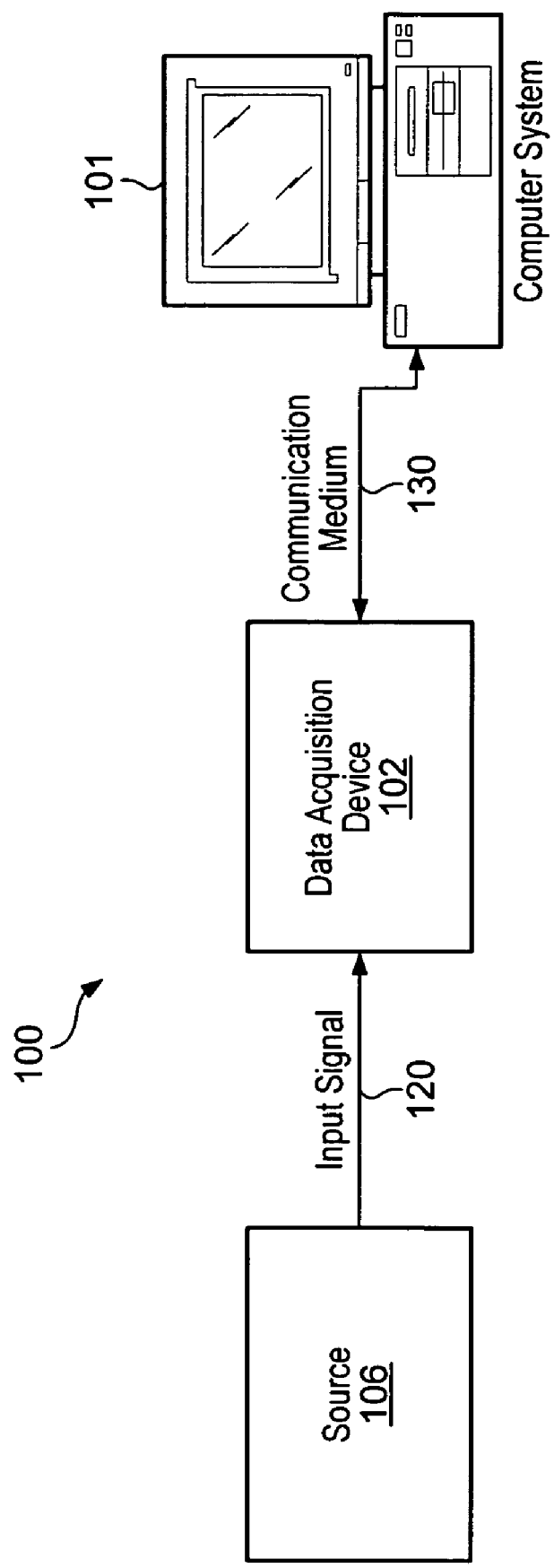
FIG. 1 is a diagram of one embodiment of a computer-based measurement system or data acquisition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

Data Acquisition System

FIG. 1 is a diagram of one embodiment of a computer-based measurement system or data acquisition system 100. The data acquisition system 100 may comprise a computer system 101, which may be coupled to a measurement device, referred to as data acquisition (DAQ) device 102, through a communication medium 130. The DAQ device 102 may be an internal card or board coupled to a bus, e.g., a Peripheral Component Interconnect (PCI), PCI Express, Industry Standard Architecture (ISA), or Extended Industry Standard Architecture (EISA) bus, but is shown external to the computer 101 for illustrative purposes. The measurement device or DAQ device 102 may also be an external device coupled to the computer system 101. In this embodiment, the communication medium 130 may be a serial bus, such as USB, IEEE 1394, MXI bus, Ethernet, or a proprietary bus, or a parallel bus such as GPIB or others. It is noted that the communication medium 130 may be a wired or wireless communication medium.

The DAQ device 102 may be coupled to an external source 106, such as an instrument, sensor, transducer, or actuator from which the DAQ device 102 may receive an input signal 120, e.g., an analog input such as sensor data. In one example, the external source 106 may be a temperature sensor, which is comprised in a unit under test (UUT). In this example, the DAQ device 102 may receive temperature reading from the temperature sensor and convert the analog data to digital form to be sent to the computer system 101 for analysis. Additionally, the DAQ device 102 may receive a digital input, e.g., a binary pattern, from the external source 106 (e.g., a UUT). Furthermore, the DAQ device 102 may also produce analog or digital signals, e.g., for stimulating the UUT.

The computer system 101 may be operable to control the DAQ device 102. For example, the computer system 101 may be operable to direct the DAQ device 102 to perform an acquisition, and may obtain data from the DAQ device 102 for storage and analysis therein. Additionally, the computer system 101 may be operable to send data to the device 102 for various purposes, such as for use in generating analog signals used for stimulating a UUT.

The computer system 101 may include a processor, which may be any of various types, including an x86 processor, e.g., a PENTIUM™ class, a POWERPC™ processor, a CPU from the SPARC™ family of RISC processors, as well as others. Also, the computer system 101 may also include one or more memory subsystems (e.g., Dynamic Random Access Memory (DRAM) devices). The memory subsystems may collectively form the main memory of computer system 101 from which programs primarily execute. The main memory may be operable to store a user application and a driver software program. The user application may be executable by the processor to conduct the data acquisition/generation process. The driver software program may be executable by the processor to receive data acquisition/generation tasks from the user application and program the DAQ device 102 accordingly.

Data Acquisition Device

Figure 2:
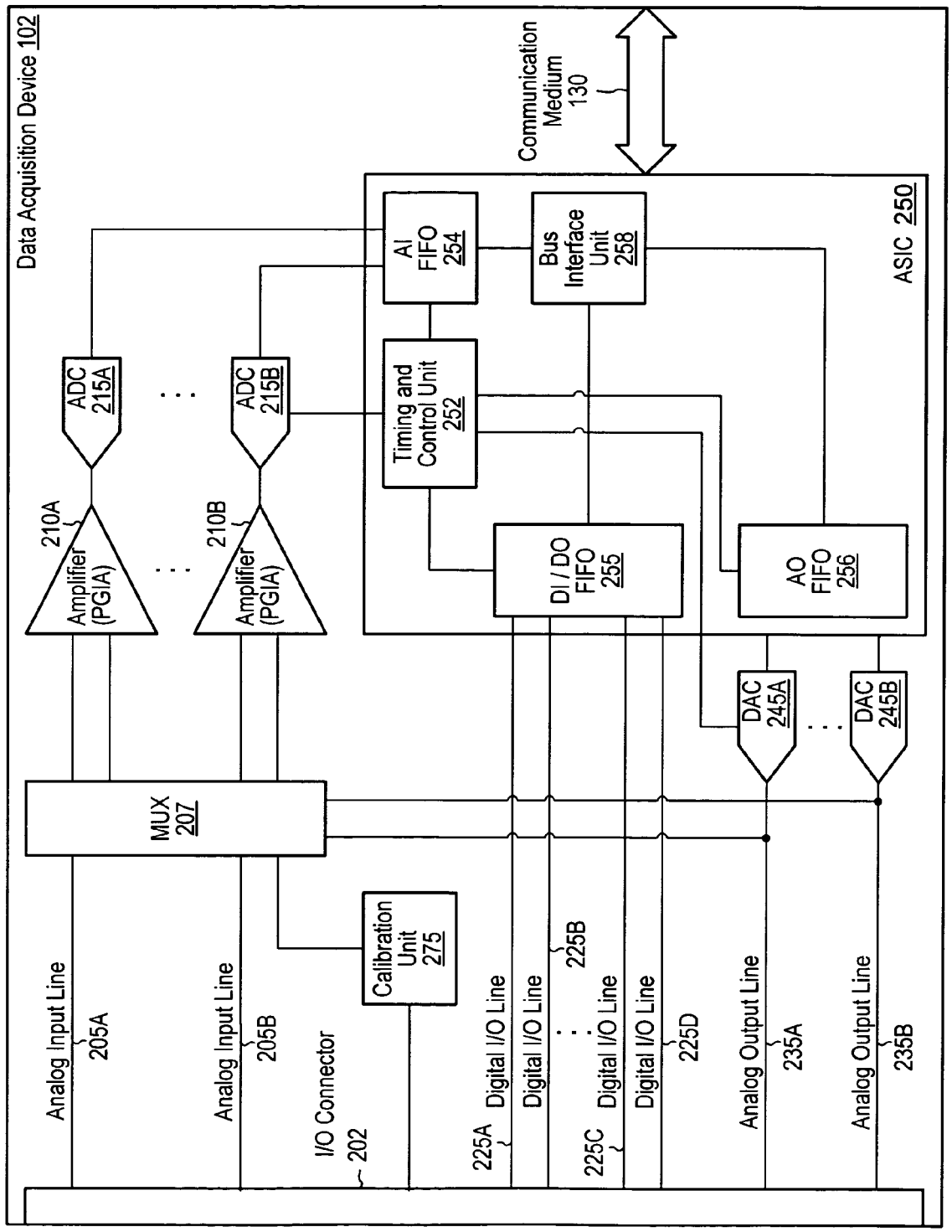
FIG. 2 is a block diagram of one embodiment of a data acquisition (DAQ) device including a calibration unit.

FIG. 2 is a block diagram of one embodiment of a data acquisition (DAQ) device 102. Components that correspond to those shown in FIG. 1 are numbered identically for simplicity and clarity. As described above, the DAQ device 102 may be an internal device coupled to, e.g., a PCI bus, or may also be an external device coupled to the computer system 101 via a serial bus, e.g., MXI bus, or a parallel bus, e.g., a GPIB. The DAQ device 102 may be a board or a module comprising one or more integrated circuits (ICs) or the DAQ device 102 may be an IC, for example, a mixed-signal IC.

The DAQ device 102 may comprise an input/output (I/O) connector 202, analog input lines 205A and 205B, multiplexer (MUX) 207, instrumentation amplifiers 210A and 210B, analog-to-digital converters (ADCs) 215A and 215B, digital I/O lines 225A, 225B, 225C, and 225D, analog output lines 235A and 235B, a timing and data control IC (e.g., application-specific integrated circuit (ASIC) 250), digital-to-analog converters (DACs) 245A and 245B, a calibration unit 275, and communication medium 130. It should be noted that the components described with reference to FIG. 2 are meant to be exemplary only, and are not intended to limit the invention to any specific set of components or configurations. For example, in various embodiments, one or more of the components described may be omitted, combined, modified, or additional components included, as desired.

The calibration unit 275 may be used to calibrate the DAQ device 102 using a pulse-width modulation (PWM) circuit, a precision reference, and a digital logic unit. In one embodiment, the digital logic unit of the calibration unit 275 may provide the PWM circuit with a pulse train of a programmable frequency and the precision reference may provide the PWM circuit with a precision reference signal. In response to receiving the pulse train and the precision reference signal, the PWM circuit of the calibration unit 275 may generate a PWM calibration signal with ripple to reduce local nonlinearities in measurements associated with a calibration of the DAQ device 102, as will be further described below with reference to FIGS. 3–7. In one embodiment, the calibration unit 275 may be coupled to one or more instrumentation amplifiers (e.g., amplifier 210A), which may additionally be coupled to one or more ADCs (e.g., ADC 215A), to provide the PWM calibration signal with ripple to the system during the calibration process. The amplifier 210A and the ADC 215A may collectively form an analog-to-digital module (ADM). It is noted however that in other embodiments the ADM may include additional or alternative components. In one embodiment, the digital logic unit may provide the PWM circuit pulse trains of varying frequency and duty cycle to sweep the PWM circuit through an ADM range and to calculate an ADM linearity correction function. The ADM linearity correction function may be used to perform gain and offset correction with respect to a best-fit line through an ADM transfer curve to reduce large signal nonlinearities, as will be further described below with reference to FIGS. 3–7.

The DAQ device 102 may receive and send digital and/or analog data via the input and output lines of the I/O connector 202. For example, the I/O connector 202 may be coupled to a signal source (e.g., source 106 of FIG. 1) comprised in a UUT to receive analog signals. The I/O connector 202 may comprise analog input lines 205A and 205B, which may convey the received analog signals to amplifier 210A and 210B via the MUX 207. It is noted however that in other embodiments the DAQ device 102 may comprise any number of analog input lines, e.g., three or more analog input lines.

In one embodiment, amplifiers 210A and 210B may be programmable gain instrumentation amplifiers (PGIAs). PGIAs are typically differential amplifiers having a high input impedance and a gain that is adjustable through the variation of a single resistor. The amplifier 210A may apply a specified amount of gain to the input signal to ensure proper analog-to-digital conversion. Also, PGIAs may convert differential input signals into single-ended outputs, which may be needed for the ADC (e.g., ADC 215A) to correctly digitize the data. It is noted however that in other embodiments amplifier 210A and/or amplifier 210B may be other types of amplifiers typically used in data acquisition devices. It is also noted that DAQ device 102 may comprise any number of amplifiers, e.g., three or more amplifiers.

The output of amplifier 210A may be connected to ADC 215A, which may digitize the analog signals. ADCs are devices that convert a continuously varying (analog) signal into a discrete (digital) signal. The resolution of the ADC typically indicates the number of discrete values it can produce. For example, if the ADC has an eight-bit resolution, the ADC may be able to encode an analog input to one of 256 discrete values (since $2^8=256$). Each discrete value is derived by sampling the analog signal at particular times (e.g., a periodic rate). More specifically, the signal values at particular times are measured and stored. An ADC typically includes a sample and hold circuit, which holds the input value constant during the time the ADC performs the analog-to-digital conversion, since the ADC cannot make an instantaneous conversion. It is noted however that in other embodiments the DAQ device 102 may comprise any number of ADCs, for example, the DAQ device 102 may include a single ADC or four ADCs.

After the signals are digitized, the ADC 215A may send the digital signals to the ASIC 250. In one embodiment, the ASIC 250 may be a digital ASIC, which may be configured to perform the timing and data control functions for the DAQ device 102. It is noted however that in other embodiments other types of timing and data control ICs may be used. The ASIC 250 may include a timing and control unit 252, an analog input (AI) first-in first-out (FIFO) buffer 254, a digital input (DI)/digital output (DO) FIFO buffer 255, an analog output (AO) FIFO buffer 256, and a bus interface unit 258. It is noted that in other embodiments one or more of the components described may be omitted, combined, modified, or additional components included, as desired.

When the ASIC 250 receives the digitized signals from the one or more ADCs, the data may be stored in AI FIFO buffer 254. FIFO buffers are storage devices that output the stored data in the order the data was received. After being stored in the AI FIFO buffer 254, the digitized data may be sent to the bus interface unit 258. In one embodiment, the bus interface unit 258 may be coupled to the communication medium 130 for sending data to and receiving data from a computer system (e.g., computer system 101 of FIG. 1). The bus interface unit 258 may be operable to implement the protocol associated with the type of bus coupled to the DAQ device 102. As described above, exemplary buses coupled to the bus interface unit 258 include a PCI, PCI Express, USB, IEEE 1394, PXI bus, or Ethernet, among others. In one embodiment, the bus interface unit 258 may send the digitized data to the computer system 101 for storage and analysis of the data.

As described above, the computer system (e.g., computer system 101 of FIG. 1) may provide digital signals to the DAQ device 102 to stimulate a UUT. In one embodiment, the digital signals may need to be converted to analog form to stimulate the UUT. Therefore, in this embodiment, after the ASIC 250 of DAQ device 102 receives the digital signals and stores them in AO FIFO buffer 256, the digital data may be transmitted to DAC 245A to be converted to analog form. DACs are devices that convert discrete (digital) signals into continuously varying (analog) signals. For example, if an analog signal was initially converted to digital form, a DAC may be able to reproduce the analog signal if provided with the digital data. It is noted that the DAQ device 102 may comprise any number of DACs, for example, other embodiments may include a single DAC or four DACs. After the digital data is converted to analog form, the analog signals may be sent to the I/O connector 202 via the analog output line 235A.

Improved Calibration of an Analog-to-Digital System

Figure 3:
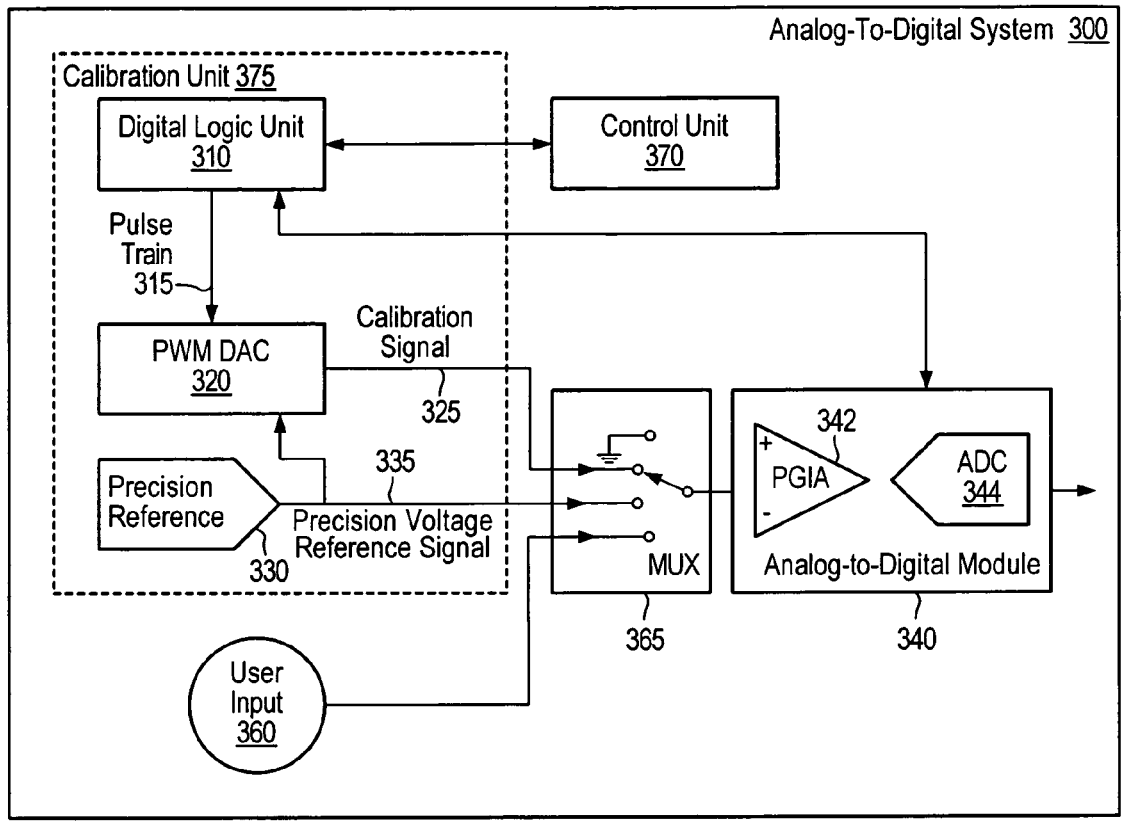
FIG. 3 is a block diagram of one embodiment of a calibration unit for calibrating an analog-to-digital system.

Turning now to FIG. 3, a block diagram of one embodiment of a calibration unit (e.g., calibration unit 275 of FIG. 2) for calibrating an analog-to-digital system 300 is shown. The DC voltage calibration unit 375 of FIG. 3 may generate a calibration signal 325 with intentional ripple to reduce local nonlinearities and may implement a linearity characterization technique to reduce sensitivity to large signal nonlinearities to improve a calibration of the analog-to-digital system, as will be described further below. The DC voltage calibration unit 375 may be comprised in the analog-to-digital system 300, which may be a board or a module comprising one or more integrated circuits (ICs), or the analog-to-digital system 300 may be an IC, for example, a mixed-signal IC. In one embodiment, the analog-to-digital system 300 may be one of various types of measurement devices, such as a data acquisition device, a digital multi meter (DMM), a digital storage oscilloscope (DSO), and other types of devices for acquiring or generating data. For example, the DC voltage calibration unit 375 may be the calibration unit 275 comprised in the data acquisition device 102 of FIG. 2. The measurement device may be a card or board plugged into one of the I/O slots of a computer system (e.g., computer system 101 of FIG. 1), or a card or board plugged into a chassis, or an external device.

In one embodiment, the DC voltage calibration unit 375 may comprise a digital logic unit 310, a pulse-width modulation (PWM) circuit (e.g., PWM digital-to-analog converter (DAC) 320), and a precision voltage reference 330. The DC voltage calibration unit 375 may be an IC or each of the components (e.g., the digital logic unit 310, the PWM DAC 320, and the precision reference 330) may each be an individual IC. In one embodiment, the DC voltage calibration unit 375 may be coupled to an analog-to-digital module (ADM) 340 via a multiplexer 365. In one embodiment, the ADM 340 may comprise analog conditioning circuitry (e.g., a programmable gain instrumentation amplifier (PGIA) 342) and an analog-to-digital converter (ADC) 344. Also, the ADM 340 may be the circuitry consisting of the PGIA 210A and the ADC 215A of FIG. 2. The DC voltage calibration unit 375 may further be coupled to a control unit 370 and to a user input terminal 360.

It should be noted that the components described with reference to FIG. 3 are meant to be exemplary only, and are not intended to limit the invention to any specific set of components or configurations. For example, in various embodiments, one or more of the components described may be omitted, combined, modified, or additional components included, as desired. Also, in other embodiments, the functionality described below with regard to the DC voltage calibration unit 375 may be distributed across multiple components.

The digital logic unit 310 may be coupled to the PWM DAC 320 to generate a pulse train 315 of a programmable frequency and duty cycle during the calibration process. In one embodiment, the control unit 370 may program the digital logic unit 310 with a particular frequency and duty cycle to generate the pulse train 315. The precision reference 330 may also be coupled to the PWM DAC 320 to provide a precision voltage reference signal 335 to the PWM DAC 320. In response to receiving the digital pulse train 315 and the precision voltage reference signal 335, the PWM DAC 320 may generate a calibration signal 325 with intentional ripple to reduce local nonlinearities in the calibration of the analog-to-digital system. Ripple may be defined as an oscillation of small amplitude imposed on top of a steady value. In this case, ripple may be an oscillation of small amplitude (e.g., 200 mV) on top of the voltage value (e.g., 9V).

In one embodiment, the control unit 370 may be implemented in hardware. In a further embodiment, the control unit 370 may be implemented in software. In yet another embodiment, the control unit 370 may be implemented in both hardware and software. In one embodiment, the functionality described above with regard to the control unit 370 may be distributed across multiple components. In various embodiments, this type of functional distribution may also apply to other components described herein.

Figure 4:
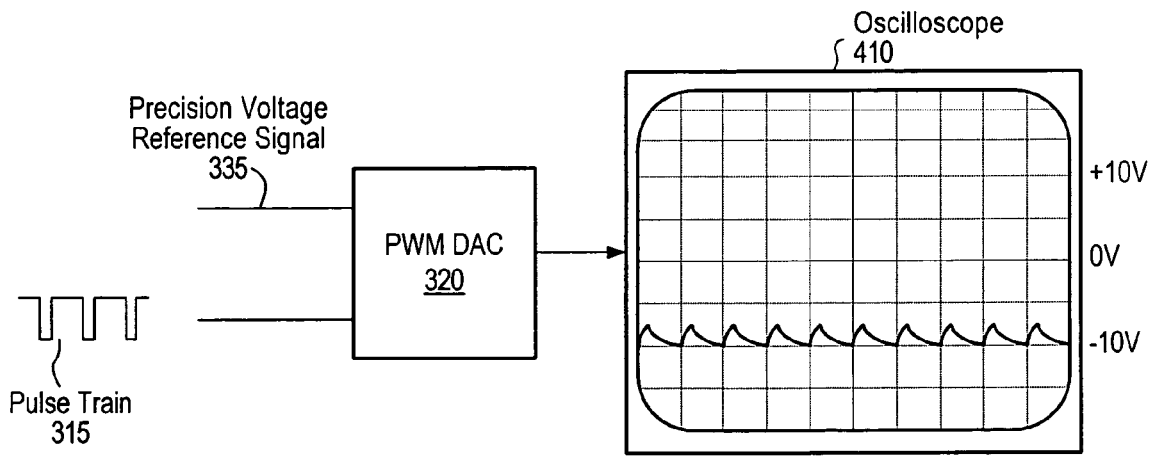
FIG. 4 is a drawing of a pulse-width modulation (PWM) circuit generating a calibration signal with intentional ripple, according to one embodiment.

Unlike prior art calibration methods in which in which a PWM DAC outputs a DC waveform with no or an insignificant amount of ripple, the PWM DAC 320 of the DC voltage calibration unit 375 may intentionally imposes ripple on the calibration signal 325 by not filtering out all the frequency components present in the input pulse train 315, as shown in FIG. 4. FIG. 4 is drawing of the PWM DAC 320 generating a calibration signal 325 with an intentional ripple, as shown on the oscilloscope 410, according to one embodiment. The PWM DAC 320 may include an op-amp circuit, as will be described further below with reference to FIG. 7. By choosing a particular pulse train frequency and analog bandwidth (of the op amp circuit), the amount of ripple at the output of the PWM DAC 320 may be controlled.

The predetermined amount of ripple in the calibration signal 325 may be useful because it may exercise a large region of the transfer curve of the ADM 340, thus making it less sensitive to local nonlinearities (e.g., integral nonlinearities) than some prior art calibration methods, as described below with reference to FIGS. 5A–5B. For example, in a typical prior art calibration method, a signal (e.g., $V_{in}$) having no or an insignificant amount of ripple may be output from a PWM DAC and received by an analog-to-digital module. In this example, the signal may result in a code out of value "5" from the ADC, whether $V_{in}$ is 2V or 2.2V. If the error ($\epsilon_0$) due to the local nonlinearities is plotted, the prior art method may result in a significant amount of error, for example, a jagged plot where the error varies a significant amount from one code to another.

Figure 5A:
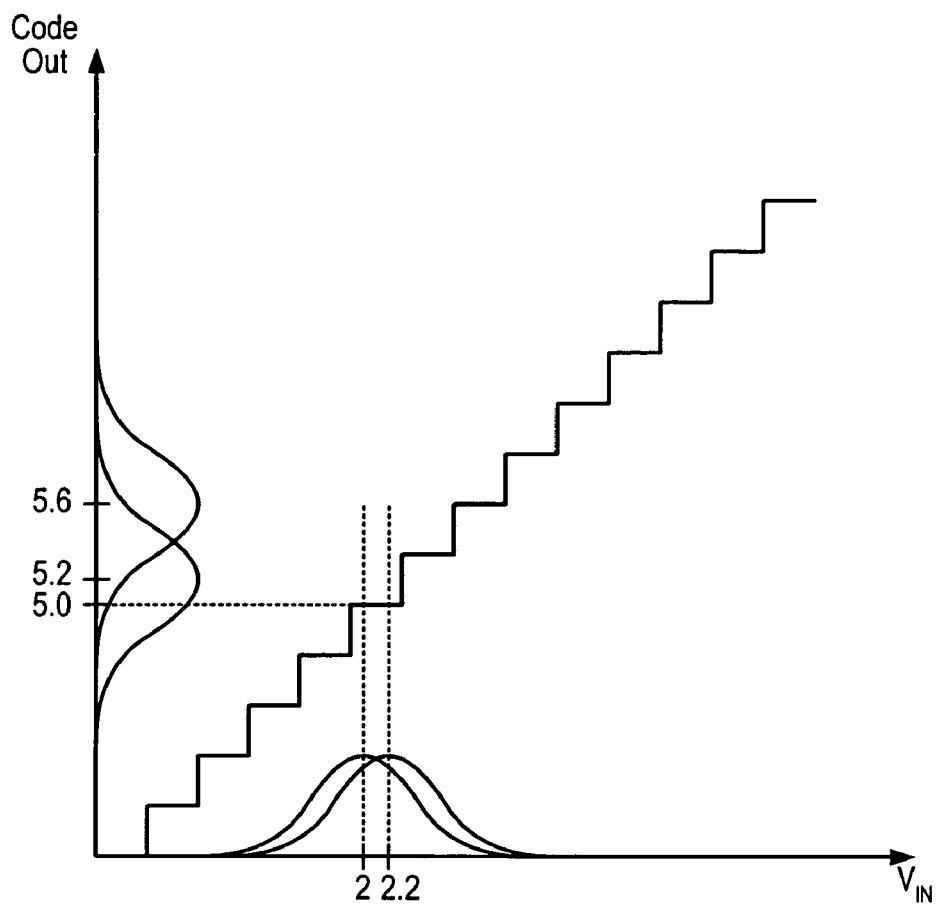
FIG. 5A is a drawing showing the ripple in the calibration signal generated by the calibration unit of FIG. 3 exercising a large region of the transfer curve of the analog-to-digital module (ADM), according to one embodiment.
Figure 5B:
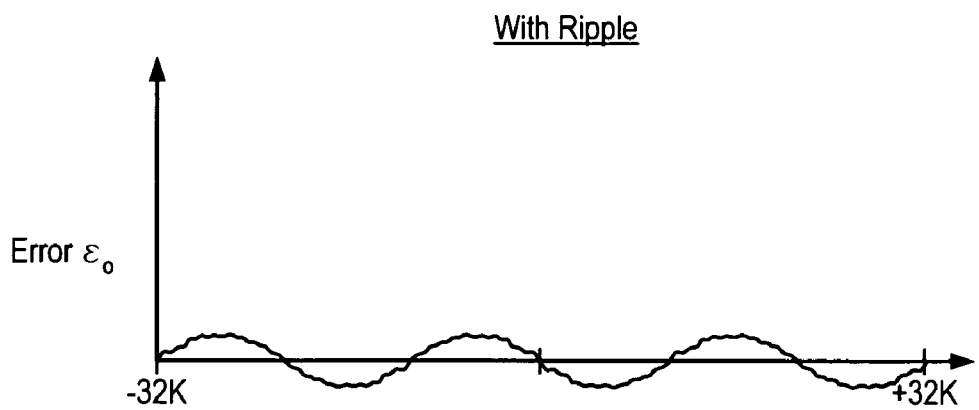
FIG. 5B is a drawing showing the error ($\epsilon_0$) corresponding to the plot of FIG. 5A, according to one embodiment.

However, according to one embodiment as illustrated in FIG. 5A, the calibration signal 325 with the intentional ripple may reduce the sensitivity to local nonlinearities. For example, as shown in FIG. 5A, when the calibration signal 325 (with ripple) of 2V is provided by the PWM DAC 320 to the ADM 340, it may result in a code out of value "5.2" from ADC 344, and when the calibration signal 325 (with ripple) is 2.2V, it may result in a code out of value "5.6". The small amplitude associated with the intentional ripple may be a distribution that exercises multiple codes instead of just one code, resulting in a more accurate average value for each measurement. In this case, two similar measurements may be distinguished instead of obtaining the same result. If the error ($\epsilon_0$) corresponding to the embodiment shown in FIG. 5A is plotted, the error may be less than the error in typical prior art calibration methods, as shown in FIG. 5B. The jagged plot may be smoothed out when the error is convoluted with the ripple because the average values obtained using the ripple reduce the jagged steps from one code to another. Therefore, by intentionally adding a predetermined amount of noise (ripple) to the calibration signal 325, it may exercise a large region of the transfer curve of the ADM 340 and lead to more accurate results (less uncertainty) than typical prior art methods by reducing the sensitivity to local nonlinearities. It is noted that the examples shown in FIGS. 5A and 5B are for illustrative purposes only and are not intended to limit the invention. In other embodiments, the $V_{in}$, code out, and $\epsilon_0$ values may vary depending on the application.

In addition to using the PWM DAC 320 to reduce local nonlinearities, the DC voltage calibration unit 375 may use the PWM DAC 320 to reduce large signal nonlinearities. Because the PWM DAC 320 is typically linear with respect to the duty cycle, it may be used to perform linearity correction on the ADM 340 during calibration. The ADM linearity characterization may be performed by sweeping the PWM DAC 320 through the entire ADM range (e.g., as shown below with reference to FIGS. 6A and 6B) and calculating the ADM linearity correction function. The ADC linearity correction function may be used throughout the calibration algorithm to perform gain and offset correction with respect to a best-fit line through the ADM transfer curve. This may make the calibration method less sensitive to large signal nonlinearities in the ADM 340 than typical prior art methods.

Figures 6A, 6B:
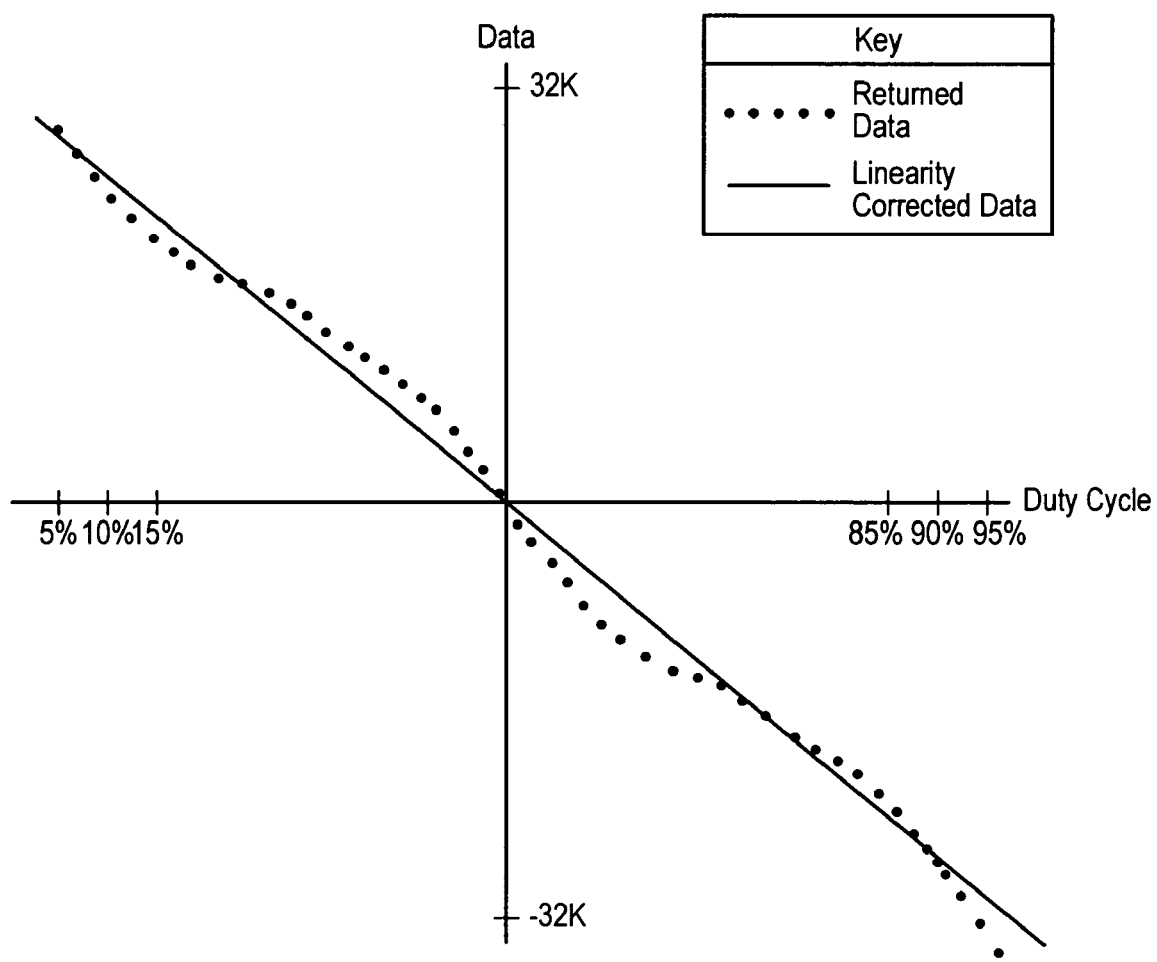
FIG. 6A is a chart of data corresponding to an ADM linearity characterization performed by sweeping the PWM circuit through the entire ADM range, according to one embodiment.
FIG. 6B is a graph of the data shown in FIG. 6A, according to one embodiment.

In one embodiment, the ADC linearity characterization may be performed by sweeping the PWM DAC 320 through the ADM range, e.g., from -10V to 10V. FIGS. 6A and 6B illustrate one example of the results that may be obtained by sweeping the PWM DAC 320 from -10V to 10V. As described above, the control unit 370 (e.g., software) may program the digital logic unit 310 to output the pulse train 315 of a particular frequency and duty cycle. By varying the duty cycle of the pulse train 315, the PWM DAC 320 outputs a different voltage (i.e., the calibration signal 325 with ripple) within the ADM range. For example, as shown in the chart of FIG. 6A, the control unit 370 may program the digital logic unit 310 to output a pulse train 315 having a 5% duty cycle. The PWM DAC 320 may output a voltage of 9.5V in response to receiving the pulse train 315 having a 5% duty cycle. In this example, the PWM DAC 320 may output a voltage of 8.8V when the received pulse train 315 has a 15% duty cycle and a voltage of -9V when the pulse train 315 has a 90% duty cycle. In response to receiving 9.5V (i.e., the calibration signal 325 with ripple), the ADM 340 (e.g., if the ADC 344 has a 16-bit digital output) may return 32k data, and in response to receiving -8.8V, the ADM 340 may return 27.7k data.

As shown in FIG. 6B, when the returned data is plotted versus duty cycle and the data points are connected, the plot is nonlinear due to errors in some components, e.g., amplifiers are not ideal. To linearly correct the data, a best-fit line with respect to the data points may determined. It is noted that when the pulse train 315 has a 5% duty cycle (9.5V output), the best-fit line does not cross at 32k, instead the line may intersect at 31.9k. Similarly, when the pulse train 315 has a duty cycle of 85% (-8.8V output), the best-fit line does not cross 27.7k, instead it may intersect at 28.2k. Therefore, the returned data may be linearly corrected using the best-fit line to obtain the linearly corrected data shown in FIG. 6A. The ADM linearity correction function may obtained from these calculations. In one embodiment, the ADM linearity correction function may be in the form of a lookup table with interpolation, which may be used to derive the linearity corrected data. In other embodiments, the ADM linearity correction function may vary depending on the application.

As described above, the ADM linearity correction function may be used throughout the calibration algorithm to perform gain and offset corrections with respect to a best-fit line through the ADM transfer curve. In one embodiment, by reading the precision reference 330 and reading ground (e.g., via the MUX 365), the gain and offset corrections can be performed based on the best-fit line. Without correcting for linearity error (e.g., calculating the ADM linearity correction function via the best-fit line), the gain and offset calibration would include error due to nonlinearities. The gain and offset calibration may be performed independently. After reading the precision reference 330 (e.g., 7V), the gain calibration may be performed with respect to the best-fit line. For example, if the precision voltage reference signal 335 is 7V, the 7V signal is digitized by the ADC (e.g., ADC 344) to obtain a binary code, and then a correction factor is added based on the best-fit line to calibrate the gain. Similarly after reading ground, the offset calibration may be performed with respect to the best-fit line.

It is noted that the examples shown in FIGS. 6A and 6B are for illustrative purposes only and are not intended to limit the invention. In other embodiments, the duty cycle, PWM DAC outputs, returned data, and linearly corrected data may vary depending on the application.

In one embodiment, the linearity correction may also be used during normal operation of the analog-to-digital system 300 to improve user data. This could be in the form of higher order polynomial scaling coefficients, lookup tables, or other methods. For example, instead of creating a gain and offset first order polynomial, the system 300 may create a third or fifth order polynomial to improve the accuracy of the user data. In one embodiment, the higher order polynomial may be based on the ADM linearity correction function and the gain and offset calculations.

Figure 7:
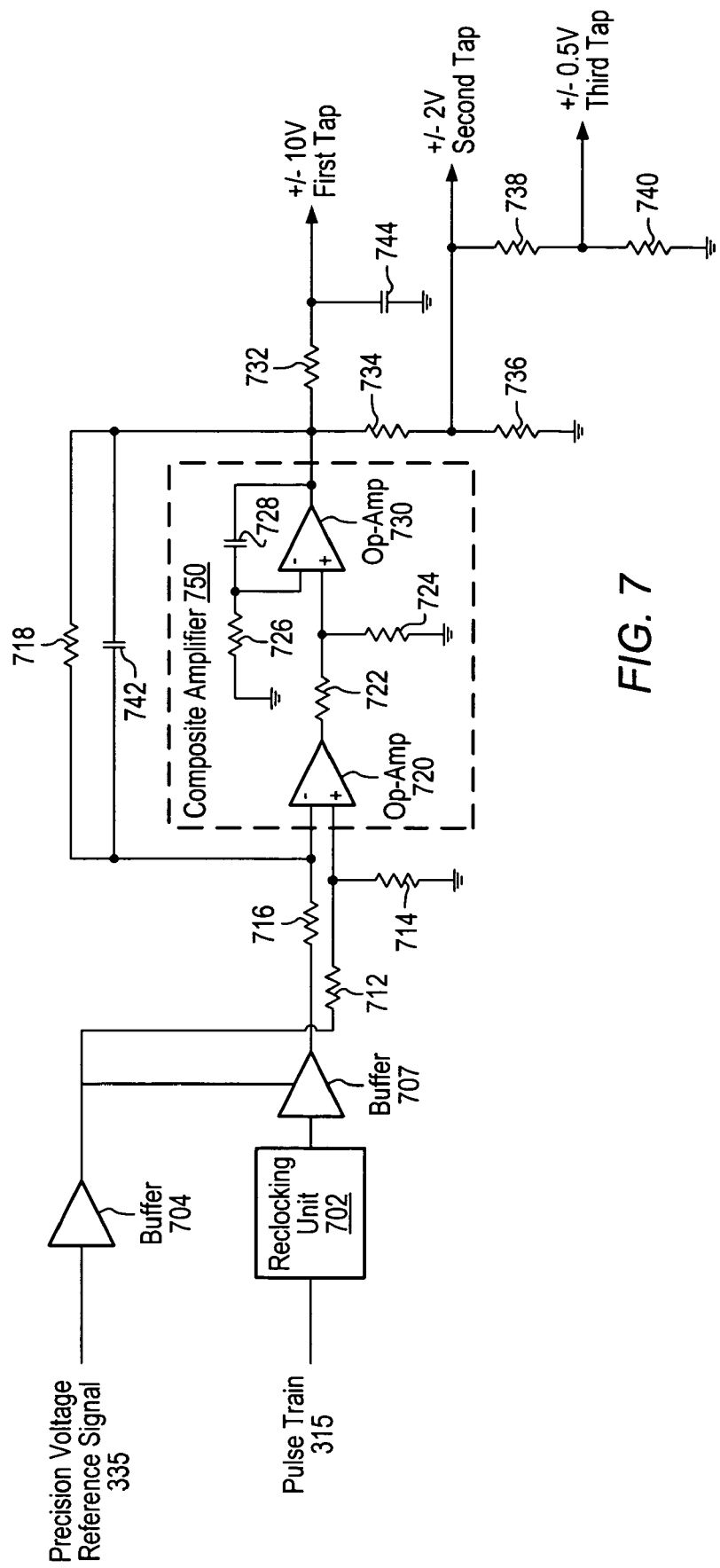
FIG. 7 is a block diagram of one embodiment of the PWM circuit comprised in the calibration unit of FIG. 3.

FIG. 7 is a block diagram of one embodiment of the PWM DAC 320 comprised in the analog-to-digital system 300. The PWM DAC 320 may be an IC, for example, a mixed-signal IC. In one embodiment, the PWM DAC 320 may comprise a reclocking unit 702, a buffer 704, a buffer 706, resistors 712, 714, 716, 718, 732, 734, 736, 738, and 740, capacitors 742 and 744, and composite amplifier 750. The composite amplifier may include an op-amp 720, an op-amp 730, resistors 722, 724, and 726, and capacitor 728. It is noted however that in other embodiments the composite amplifier may be replaced with a single op-amp having similar functionality.

As described above, the PWM DAC 320 may receive a precision voltage reference signal 335 from the precision reference 330 and a pulse train 315 from digital logic chip 310. In one embodiment, the pulse train 315 may be reclocked by the reclocking unit 702 to reduce jitter. Also, the precision voltage reference signal 335 may be divided down by the resistors 712 and 714 before being received by the composite amplifier 750. The output of the PWM DAC 320 may include one or more taps, each tap corresponding to a particular voltage range. For example, the first tap in FIG. 7 corresponds to the ±10V range, the second tap corresponds to the ±2V range, and the third tap corresponds to the ±0.5V range. It is noted however that the PWM DAC 320 may include any number of taps corresponding to any voltage range.

In one embodiment, the reclocking unit 702 may be coupled to the buffer 706, which may be coupled to the resistor 716. The resistor 716 may be connected to the resistor 718, the capacitor 742, and to one of the inputs of the composite amplifier 750. Also, the buffer 704 may be coupled to the resistor 712, which may be coupled to the resistor 714 and to the other input of the composite amplifier 750. The output of the composite amplifier 750 may be connected to the resistor 718, the capacitor 742, the resistor 732, and the resistor 734. Additionally, the resistor 732 may be coupled to the resistor 734, the capacitor 744, and the first tap (e.g., ±10V range). The resistor 734 may be connected to the resistor 736, the resistor 738, and the second tap (e.g., ±2V range). The resistor 738 may be coupled to the second tap, the third tap (e.g., ±0.5V range), and the resistor 740. In one embodiment, the composite amplifier may include the op-amp 720 coupled to the resistor 722, which may be coupled to the resistor 724 and the noninverting input of the op-amp 730. Also, the resistor 726 may be coupled to the inverting input of the op-amp 730 and to the capacitor 728. Furthermore, the capacitor 728 may be coupled to the output of the composite amplifier 750.

It should be noted that the components described with reference to FIG. 7 are meant to be exemplary only, and are not intended to limit the invention to any specific set of components or configurations. For example, in various embodiments, one or more of the components described may be omitted, combined, modified, or additional components included, as desired. For instance, in some embodiments, the number of resistors and capacitors may vary, e.g., the resistor 736 of the PWM DAC 320 may represent the combination of two resistors in series and the capacitor 742 may represent the combination of two capacitors in parallel.

To improve the ability to calibrate small input ranges, the PWM DAC 320 may be divided down and picked off of different "taps" (e.g., the first, second, and third taps shown in FIG. 7) in a resistor divider. In this case, each tap may need to be calibrated. For example, in one embodiment, after calibrating the gain, offset, and linearity of the range associated with the first tap (e.g., ±10V range) as described above, the calibrated range may be used to calibrate the slope of the PWM DAC 320 (e.g., the slope of the first tap). When the slope of the PWM DAC 320 is calibrated, it may be used to calibrate smaller input ranges, e.g., a ±5V range and a ±2V range. In one embodiment, one of the smaller ranges (e.g., ±2V range) may be associated with the second tap. Once the smaller range is calibrated, the slope of the second tap may be calibrated. When the slope of the second tap is calibrated, it may be used to calibrate increasingly smaller ranges, e.g., a ±1V range and a ±0.5V range. In one embodiment, one of these ranges (e.g., ±0.5V range) may be associated with the third tap. When this particular range is calibrated, the calibrated range is used to calibrate the slope of the third tap. Once the slope of the third tap is calibrated, it may be used to calibrate further smaller ranges, e.g., a ±0.2V range and a ±0.1V range. In other words, each tap may be calibrated by comparing the output of a calibrated tap to the output of an uncalibrated tap.

In one embodiment, the mean of the PWM DAC 320 in the presence of ripple may be determined. If the PWM DAC 320 and the ADM 340 exist in the same clock domain (which is generally the case for these devices), then it may be possible to sample exact integer numbers of cycles of the ripple function. Additionally, making the sampling frequency of the ADM 340 and the ripple frequency of the PWM DAC 320 be relatively prime submultiples of the system clock may yield further optimal sampling of the ripple. When such synchronization is not possible, advanced DC estimation techniques may be used to extract the DC value in the presence of the ripple.

For systems that have analog output as well as analog input (e.g., analog-to-digital system 300), the output may be calibrated by wrapping it back to the input. For example, as shown in FIG. 2, the analog output lines 235A and 235B of the data acquisition device 102 may be wrapped around to the analog input. In one embodiment, the analog output lines 235A and 235B may be coupled to the MUX 207. The analog input may then employ its thorough characterization to accurately determine the transfer function of the DAC (e.g., DAC 245A) and make necessary corrections.

Because the PWM DAC 320 may contain elements that contribute to errors (e.g., an op amp), the PWM DAC 320 may need to be calibrated itself before it can be used, e.g., to calibrate the device 300. Therefore, in one embodiment, the PWM DAC 320 may be first calibrated by comparing it to a stable reference, and then the calibrated PWM DAC 320 may be used to generate signals that directly calibrate a measurement device (e.g., device 300). Therefore, an external calibration technique may be implemented. By application of the user input 360, shown in FIG. 3, external user-supplied signals may be measured during calibration. These signals may be compared to the internal reference 330 in order to provide a traceable link between the internal reference 330 and an external precision source. In one embodiment, the linearity correction methods of the ADM 340 may be employed to accurately compare the two references. Specifically, the PWM DAC 320 may be routed to the ADM (−) input while the internal and external references may be routed to the ADM (+) input. In one embodiment, the ripple generated by the PWM DAC 320 may be used to make these readings insensitive to nonlinearities in the transfer curve.

The calibration methods described above measure the errors in the ADM 340 (or analog outputs) and these methods are independent of how the correction of the errors are specifically performed. During normal device operation, correction itself may be performed in the analog domain (e.g., by application of trimpots or calibration DACs or other methods), or data can be scaled following analog-to-digital conversion (e.g., by firmware/software or the like).

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A calibration unit for use in an analog-to-digital (A/D) system, the calibration unit comprising:
   a pulse-width modulation (PWM) circuit;
   a digital logic unit operable to provide the PWM circuit with a pulse train of a programmable frequency and duty cycle; and
   a precision reference operable to provide the PWM circuit with a precision reference signal;
   wherein in response to receiving the pulse train and the precision reference signal, the PWM circuit is operable to generate a calibration signal with ripple to reduce local nonlinearities in measurements associated with a calibration of the A/D system.

2. The calibration unit of claim 1, wherein the calibration unit comprises an output coupled to an analog-to-digital module (ADM) of the A/D system, wherein the ADM includes analog conditioning circuitry and an analog-to-digital converter (ADC), wherein the ADM is operable to receive the calibration signal with ripple from the PWM circuit.

3. The calibration unit of claim 2, wherein the ripple is operable to exercise a region of a transfer curve of the ADM to reduce local nonlinearities in measurements associated with the calibration of the A/D system.

4. The calibration unit of claim 1, further comprising a control unit operable to program the digital logic unit with a frequency and duty cycle to generate the pulse train.

5. The calibration unit of claim 4, wherein the control unit is operable to intentionally impose a predetermined amount of ripple on the calibration signal by programming the digital logic unit with a particular pulse train frequency.

6. The calibration unit of claim 4, wherein the control unit is operable to program the digital logic unit to generate pulse trains of varying frequency and duty cycle to sweep the PWM circuit through an analog-to-digital module (ADM) range and to calculate an ADM linearity correction function.

7. The calibration unit of claim 6, wherein the control unit is operable to use the ADM linearity correction function during the calibration of the A/D system to perform gain and offset correction with respect to a best-fit line through an ADM transfer curve, to reduce large signal nonlinearities in measurements associated with the calibration of the A/D system.

8. The calibration unit of claim 7, wherein the PWM circuit comprises a resistor divider circuit including a plurality of taps, wherein each tap corresponds to a particular input voltage range, wherein the taps improve a calibration of various input voltage ranges.

9. The calibration unit of claim 7, wherein the control unit is operable to use a calibrated first input voltage range corresponding to a first tap to calibrate the slope associated with the first tap.

10. The calibration unit of claim 9, wherein the control unit is operable to:
    use the calibrated slope associated with the first tap to calibrate a second input voltage range which is smaller than the first input voltage range, and
    use the calibrated second input voltage range corresponding to a second tap to calibrate the slope associated with the second tap.

11. The calibration unit of claim 10, wherein the control unit is operable to:
    use the calibrated slope associated with the second tap to calibrate a third input voltage range which is smaller than the second input voltage range, and
    use the calibrated third input voltage range corresponding to a third tap to calibrate the slope associated with the third tap.

12. The calibration unit of claim 7, wherein the control unit is also operable to generate a high order polynomial based on the ADM linearity correction function and the gain and offset correction operations to perform linearity correction on user data.

13. The calibration unit of claim 6, wherein the ADM linearity correction function is a lookup table.

14. The calibration unit of claim 1, comprised in a data acquisition device.

15. A data acquisition device comprising:
    one or more analog-to-digital converters (ADCs) operable to convert received analog data into digital data; and
    a calibration unit coupled to the one or more ADCs, the calibration unit comprising:
    a pulse-width modulation (PWM) circuit;
    a digital logic unit operable to provide the PWM circuit with a pulse train of a programmable frequency and duty cycle; and
    a precision reference operable to provide the PWM circuit with a precision reference signal;
    wherein in response to receiving the pulse train and the precision reference signal, the PWM circuit is operable to generate a calibration signal with ripple to reduce local nonlinearities in measurements associated with a calibration of the data acquisition device.

16. The data acquisition device of claim 15, further comprising an analog-to-digital module (ADM) coupled to the calibration unit, wherein the ADM includes analog conditioning circuitry and at least one of the ADCs, wherein the ADM is operable to receive the calibration signal with ripple from the PWM circuit.

17. The data acquisition device of claim 16, wherein the ripple is operable to exercise a region of a transfer curve of the ADM to reduce local nonlinearities in measurements associated with the calibration of the data acquisition device.

18. The data acquisition device of claim 15, wherein the calibration unit further comprises a control unit operable to program the digital logic unit with a frequency and duty cycle to generate the pulse train.

19. The data acquisition device of claim 18, wherein the control unit is operable to intentionally impose a predetermined amount of ripple on the calibration signal by programming the digital logic unit with a particular pulse train frequency.

20. The data acquisition device of claim 18, wherein the control unit is operable to program the digital logic unit to generate pulse trains of varying frequency and duty cycle to sweep the PWM circuit through an analog-to-digital module (ADM) range and to calculate an ADM linearity correction function.

21. The data acquisition device of claim 20, wherein the control unit is operable to use the ADM linearity correction function during the calibration of the data acquisition device to perform gain and offset correction with respect to a best-fit line through an ADM transfer curve, to reduce large signal nonlinearities in measurements associated with the calibration of the data acquisition device.

22. The data acquisition device of claim 21, wherein the PWM circuit comprises a resistor divider circuit including a plurality of taps, wherein each tap corresponds to a particular input voltage range, wherein the taps improve a calibration of various input voltage ranges.

23. The data acquisition device of claim 22, wherein the control unit is operable to use a calibrated first input voltage range corresponding to a first tap to calibrate the slope associated with the first tap.

24. The data acquisition device of claim 23, wherein the control unit is operable to:
use the calibrated slope associated with the first tap to calibrate a second input voltage range which is smaller than the first input voltage range, and
use the calibrated second input voltage range corresponding to a second tap to calibrate the slope associated with the second tap.

25. The data acquisition device of claim 24, wherein the control unit is operable to:
use the calibrated slope associated with the second tap to calibrate a third input voltage range which is smaller than the second input voltage range, and
use the calibrated third input voltage range corresponding to a third tap to calibrate the slope associated with the third tap.

26. The data acquisition device of claim 21, wherein the control unit is also operable to generate a high order polynomial based on the ADM linearity correction function and the gain and offset correction operations to perform linearity correction on user data.

27. The data acquisition device of claim 26, further comprising one or more analog input and analog output lines coupled to the calibration unit, wherein the control unit is operable to calibrate an analog input and analog output of the data acquisition device.

28. The data acquisition device of claim 20, wherein the ADM linearity correction function is a lookup table.

29. The data acquisition device of claim 15, comprised in a data acquisition system comprising a computer system for processing data obtained from one or more data acquisition processes.

30. The data acquisition device of claim 15, comprised in a data acquisition system further comprising a unit under test (UUT), wherein the UUT comprises a sensor operable to provide the data acquisition device with sensor data.

31. A method for calibrating an analog-to-digital (A/D) system using a pulse-width modulation (PWM) circuit, the method comprising:
providing the PWM circuit with a pulse train of a programmable frequency and duty cycle;
providing the PWM circuit with a precision reference signal; and
in response to receiving the pulse train and the precision reference signal, the PWM circuit generating a calibration signal with ripple to reduce local nonlinearities in measurements associated with the calibration of the A/D system.

32. The method of claim 31, wherein the A/D system includes a control unit and a digital logic unit, further comprising the control unit programming the digital logic unit with a frequency and duty cycle to generate the pulse train.

33. The method of claim 32, further comprising intentionally imposing a predetermined amount of ripple on the calibration signal by programming the digital logic unit with a particular pulse train frequency.

34. The method of claim 32, further comprising programming the digital logic unit to generate pulse trains of varying frequency and duty cycle to sweep the PWM circuit through an analog-to-digital module (ADM) range and to calculate an ADM linearity correction function.

35. The method of claim 34, further comprising determining a best-fit line through an ADM transfer curve.

36. The method of claim 34, further comprising performing gain and offset correction with respect to a best-fit line through an ADM transfer curve by using the ADM linearity correction function, to reduce large signal nonlinearities in measurements associated with the calibration of the A/D system.

37. The method of claim 36, further comprising generating a high order polynomial based on the ADM linearity correction function and the gain and offset correction operations to perform linearity correction on user data.

38. The method of claim 37, further comprising calibrating an analog input and an analog output of the A/D system.

39. The method of claim 31, wherein the A/D system includes an analog-to-digital module (ADM), wherein the ADM includes analog conditioning circuitry and an analog-to-digital converter (ADC), further comprising the ADM receiving the calibration signal with ripple from the PWM circuit, the ripple exercising a region of a transfer curve of the ADM to reduce local nonlinearities in measurements associated with the calibration of the A/D system.

40. The method of claim 31, wherein the PWM circuit comprises a resistor divider circuit including a plurality of taps, each tap corresponding to a particular input voltage range, wherein the taps improve a calibration of various input voltage ranges, further comprising using a calibrated first input voltage range corresponding to a first tap to calibrate the slope associated with the first tap.

41. The method of claim 40, further comprising:
using the calibrated slope associated with the first tap to calibrate a second input voltage range which is smaller than the first input voltage range, and
using the calibrated second input voltage range corresponding to a second tap to calibrate the slope associated with the second tap.

42. The method of claim 41, further comprising:
using the calibrated slope associated with the second tap to calibrate a third input voltage range which is smaller than the second input voltage range, and
using the calibrated third input voltage range corresponding to a third tap to calibrate the slope associated with the third tap.

43. The method of claim 42, further comprising using the calibrated slope associated with the third tap to calibrate a fourth input voltage range which is smaller than the third input voltage range.

44. The method of claim 31, further comprising calibrating the PWM circuit by using a precision reference external to the A/D system.

45. A data acquisition device comprising:
an analog-to-digital module (ADM) including analog conditioning circuitry and an analog-to-digital converter (ADC); and
a calibration unit coupled to the ADM, the calibration unit comprising:

a pulse-width modulation (PWM) circuit;

a digital logic unit operable to provide the PWM circuit with a pulse train of a programmable frequency and duty cycle; and a control unit operable to program the digital logic unit to generate pulse trains of varying frequency and duty cycle to sweep the PWM circuit through an ADM range and to calculate an ADM linearity correction function, wherein the control unit is operable to use the ADM linearity correction function during a calibration of the data acquisition device to perform gain and offset correction with respect to a best-fit line through an ADM transfer curve, to reduce large signal nonlinearities in measurements associated with the calibration of the data acquisition device.

46. A data acquisition device comprising:

an analog-to-digital module (ADM) including analog conditioning circuitry and an analog-to-digital converter (ADC); and a calibration unit coupled to the ADM, the calibration unit comprising:

a pulse-width modulation (PWM) circuit;

a digital logic unit coupled to the PWM circuit and operable to provide the PWM circuit with a pulse train of a programmable frequency and duty cycle;

a precision reference also coupled to the PWM circuit and operable to provide the PWM circuit with a precision reference signal;

wherein in response to receiving the pulse train and the precision reference signal, the PWM circuit is operable to generate and provide a calibration signal with ripple to the ADM, wherein the ripple is operable to exercise a region of a transfer curve of the ADM to reduce local nonlinearities in measurements associated with a calibration of the data acquisition device; and a control unit operable to program the digital logic unit to generate pulse trains of varying frequency and duty cycle to sweep the PWM circuit through an ADM range and to calculate an ADM linearity correction function, wherein the control unit is operable to use the ADM linearity correction function during the calibration of the data acquisition device to perform gain and offset correction with respect to a best-fit line through an ADM transfer curve, to reduce large signal nonlinearities in measurements associated with the calibration of the data acquisition device.

* * * * *

UNITED STATES PATENT AND TRADEMARK OFFICE
CERTIFICATE OF CORRECTION

| | | |
|---|---|---|
| PATENT NO. | : 7,146,283 B2 | Page 1 of 1 |
| APPLICATION NO. | : 11/107342 | |
| DATED | : December 5, 2006 | |
| INVENTOR(S) | : Daigle et al. | |

It is certified that error appears in the above-identified patent and that said Letters Patent is hereby corrected as shown below:

Title page:

(74) Attorney, Agent, or Firm: please delete "Meyerstons Hood Kivlin" and substitute -- Meyertons Hood Kivlin --;

Signed and Sealed this

Tenth Day of April, 2007

JON W. DUDAS
*Director of the United States Patent and Trademark Office*

UNITED STATES PATENT AND TRADEMARK OFFICE
CERTIFICATE OF CORRECTION

PATENT NO.       : 7,146,283 B2                                             Page 1 of 1
APPLICATION NO.  : 11/107342
DATED            : December 5, 2006
INVENTOR(S)      : Daigle et al.

It is certified that error appears in the above-identified patent and that said Letters Patent is hereby corrected as shown below:

Claims:

Column 13 Line 59, please delete "The calibration unit of claim 7, wherein" and substitute -- The calibration unit of claim 8, wherein --.

Signed and Sealed this

Twenty-fifth Day of November, 2008

JON W. DUDAS
*Director of the United States Patent and Trademark Office*